(12) United States Patent
Higaki et al.

(10) Patent No.: US 8,618,657 B2
(45) Date of Patent: Dec. 31, 2013

(54) SEMICONDUCTOR DEVICE WITH MULTILAYER WIRING STRUCTURE FORMED WITHIN AND METHOD OF MANUFACTURING THE SAME

(75) Inventors: Kiichiro Higaki, Kanagawa-ken (JP); Koichi Sugihara, Kanagawa-ken (JP); Katsuya Murakami, Tokyo (JP); Shigenori Sawachi, Kanagawa-ken (JP); Mitsuru Oida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 345 days.

(21) Appl. No.: 12/535,775

(22) Filed: Aug. 5, 2009

(65) Prior Publication Data
US 2010/0032833 A1 Feb. 11, 2010

(30) Foreign Application Priority Data
Aug. 8, 2008 (JP) ................. 2008-205945

(51) Int. Cl.
*H01L 23/498* (2006.01)
*H01L 21/60* (2006.01)

(52) U.S. Cl.
USPC ............ 257/737; 257/E21.506; 257/E23.068; 438/106; 438/107

(58) Field of Classification Search
USPC .......... 257/737, E21.506, E23.068, 738, 777; 438/106, 107, 109
See application file for complete search history.

(56) References Cited

U.S. PATENT DOCUMENTS

| | | | |
|---|---|---|---|
| 6,559,540 B2 | 5/2003 | Kawashima | |
| 6,878,465 B2 | 4/2005 | Moon et al. | |
| 7,271,030 B2 | 9/2007 | Bojkov et al. | |
| 2006/0189033 A1* | 8/2006 | Kim | 438/109 |
| 2006/0192287 A1* | 8/2006 | Ogawa et al. | 257/758 |
| 2008/0029887 A1* | 2/2008 | Ramanathan et al. | 257/737 |
| 2008/0150135 A1* | 6/2008 | Oyama et al. | 257/738 |

* cited by examiner

*Primary Examiner* — Lynne Gurley
*Assistant Examiner* — Vernon P Webb
(74) *Attorney, Agent, or Firm* — White & Case LLP (57) ABSTRACT

A semiconductor device includes a semiconductor chip of a multilayer wiring structure having an insulating film formed on a surface thereof, multiple electrode pads formed at a central part and an outer peripheral part of the insulating film, and multiple protective metal layers formed respectively on the electrode pads. The semiconductor device also includes a substrate having the semiconductor chip mounted thereon and including multiple substrate terminals formed on a surface thereof respectively in positions corresponding to the electrode pads. The semiconductor chip is mounted on the substrate by connecting a stud bump to a solder bump. The stud bump is formed on any one of each of the protective metal layers and each of the substrate terminals and the solder bump is formed on the other one of each of the protective metal layers and each of the substrate terminals.

5 Claims, 8 Drawing Sheets

| ELASTIC MODULUS THICKNESS | 50GPa | 100GPa | 130GPa | 200GPa | 300GPa | 400GPa |
|---|---|---|---|---|---|---|
| 1.5μm | NG | NG | NG | OK | OK | OK |
| 2μm | OK | OK | OK | OK | OK | OK |
| 3μm | OK | OK | OK | OK | OK | OK |
| 5μm | OK | OK | OK | OK | OK | OK |
| 10μm | OK | OK | OK | OK | OK | OK |

SEMICONDUCTOR DEVICE WITH MULTILAYER WIRING STRUCTURE FORMED WITHIN AND METHOD OF MANUFACTURING THE SAME

CROSS-REFERENCE TO RELATED APPLICATIONS

This application is based upon and claims the benefit of priority from the prior Japanese Patent Application No. 2008-205945, filed on Aug. 8, 2008; the entire contents of which are incorporated herein by reference.

BACKGROUND OF THE INVENTION

1. Field of the Invention

The present invention relates to a semiconductor device and method of manufacturing the semiconductor device, or more specifically to a flip-chip mounted semiconductor device.

2. Description of the Related Art

Semiconductor devices have been made smaller in size, highly functional, and highly efficient recently. Accordingly, power consumption of the devices has been increasing. This increase is attributable to longer loops of bonding wires and to deterioration in electric properties associated with an increase in the number of electrodes along an increase in the number or signals, i.e. an increase in the number of wires, for example.

Flip-chip mounting, widely known as a technique for dealing with the above-mentioned problem, is a method of mounting a chip on a substrate in the following manner. A substrate has, on a surface thereof, a stud bump having a pointed top and made of high melting point metal. A semiconductor chip has a solder bump formed on an electrode on a surface thereof. Here, the stud bump is inserted into the solder bump which is melted by heating in a range from 300° C. to 400° C. Then a pressure is applied to the semiconductor chip so as to squash the stud bump in order to obtain a desired interval between the substrate and the semiconductor chip (Japanese Patent Application Publication No. 2007-43010).

In this mounting method, the stud bump is squashed when the semiconductor chip is mounted. This leads to a problem that the pressure applied during this mounting operation damages a wiring layer formed below the electrode on the surface of the semiconductor chip, and an insulating film located between the electrode and the wiring layer. Moreover, the heat generated during the mounting operation also damages the wiring layer and the insulating film between the electrode and the wiring layer. The damages thus caused on the wiring layer and the insulating film generate a leak current that leads to deterioration in electric properties of the device. Considering that numerous wiring layers are usually formed at the central part of a semiconductor chip, the above-mentioned flip-chip mounting has difficulty in forming the electrodes at the central part of the semiconductor chip.

The fact that the electrodes can not be formed at the central part of the semiconductor chip as in the above case, along with the recent size reduction of the semiconductor chips, leads to deterioration in the electric properties. Specifically, when the above-described flip-chip mounting method is employed, electrodes are only allowed to be formed at an outer peripheral part of a semiconductor chip. Therefore, power source electrodes are also allowed to be formed only at the outer peripheral part. However, reduction in chip size reduces the width of silicon wiring that connects the power source electrodes and a semiconductor element formed at the central part of the chip. Accordingly, resistance of the silicon wiring increases and a voltage drop occurs as a consequence. Therefore, when the power source electrodes are formed at the outer peripheral part of the semiconductor element, a voltage to be supplied to the semiconductor element is below a voltage fed to a power source due to the voltage drop attributable to the silicon wiring. This leads to a problem of deterioration in the electric properties of the semiconductor chip as a whole.

Here, there is known a substrate having power source electrodes arranged in a lattice fashion on a surface at a central part and having signal electrodes arranged in a lattice fashion on an overall surface in the periphery of these power source electrodes located at the central part (Japanese Patent Application Publication No. 2000-307005).

However, the above-described substrate is for a semiconductor device under a standard where solder balls are formed entirely on a back surface in a lattice fashion. The substrate for the semiconductor device under such a standard requires numerous electrodes on the surface of the substrate, numerous solder balls to be formed on the entire back surface thereof, and numerous wiring layers to form wiring for establishing connection among the electrodes and the solder balls. Hence this configuration has a problem of high costs for manufacturing the substrate. Moreover, the power source electrodes to be formed at the central part of this substrate are connected to the respective solder balls on the back surface through respective through-holes formed immediately below the electrodes. Accordingly, there is also a problem of design restriction for the wiring to be formed on the respective wiring layers.

That is to say, according to the related arts of semiconductor devices each obtained by flip-chip mounting a semiconductor chip on a substrate, the substrate and the semiconductor chip are designed with low freedom and a semiconductor device having excellent electric properties is hardly achieved.

SUMMARY OF THE INVENTION

According to an aspect of the invention, there is provided a semiconductor device comprising a semiconductor chip of a multilayer wiring structure including: an insulating film formed on a surface of the semiconductor chip; multiple electrode pads formed at a central part and an outer peripheral part of the insulating film; and multiple protective metal layers formed respectively on the electrode pads. The semiconductor device also includes a substrate having the semiconductor chip mounted thereon and including multiple substrate terminals formed on a surface thereof respectively in positions corresponding to the electrode pads. Here, the semiconductor chip is mounted on the substrate by connecting a stud bump, which is formed on any one of each of the protective metal layers and each of the substrate terminals, to a solder bump, which is formed on another one of each of the protective metal layers and each of the substrate terminals.

According to another aspect of the invention, there is provided a method of manufacturing a semiconductor device comprises the steps of forming protective metal layers respectively on multiple electrode pads formed at a central part and an outer peripheral part on an insulating film formed on a surface of a semiconductor chip having a multilayer wiring structure, forming a stud bump on any one of each of the protective metal layers and a substrate terminal on a surface of a substrate while forming a solder bump on the other one of each of the protective metal layers and the substrate terminal, and inserting the stud bump respectively into the solder bump.

DETAILED DESCRIPTION OF THE INVENTION

Now, embodiments of a semiconductor device according to the present invention will be described below with reference to the accompanying drawings.
First Embodiment To begin with, a semiconductor device according to a first embodiment of the present invention will be described with reference to FIG. 1 to FIG. 9. Note that the semiconductor device according to this embodiment is obtained by flip-chip mounting a semiconductor chip 11 on a substrate 21. The semiconductor chip 11 and a substrate 21 are described later. Now, the semiconductor chip 11 and the substrate 21 will be described below in detail.

Figure 1:
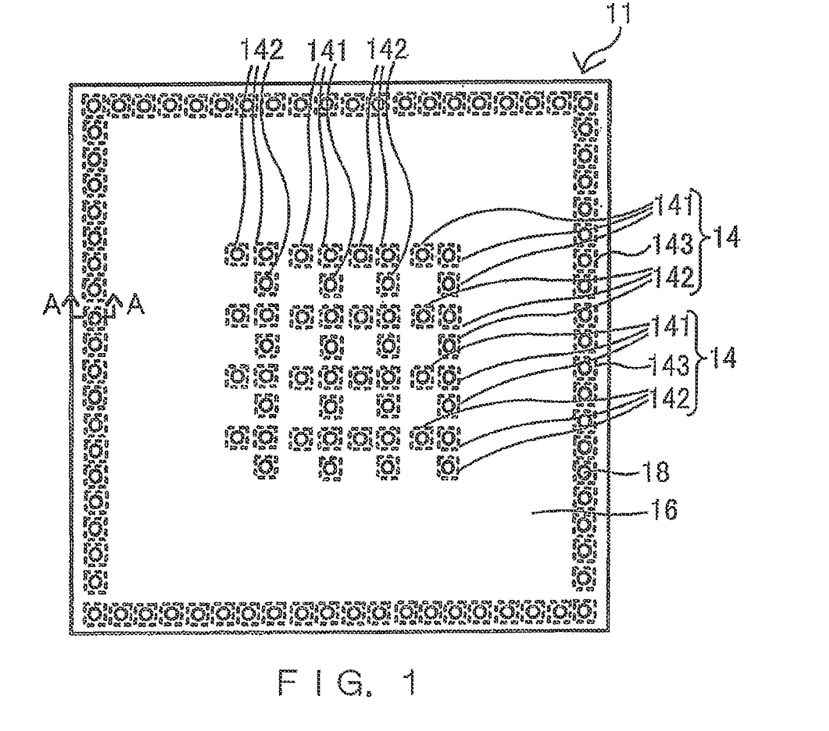
FIG. 1 is a top plan view showing a semiconductor chip of a semiconductor device according to a first embodiment of the present invention.
Figure 2:
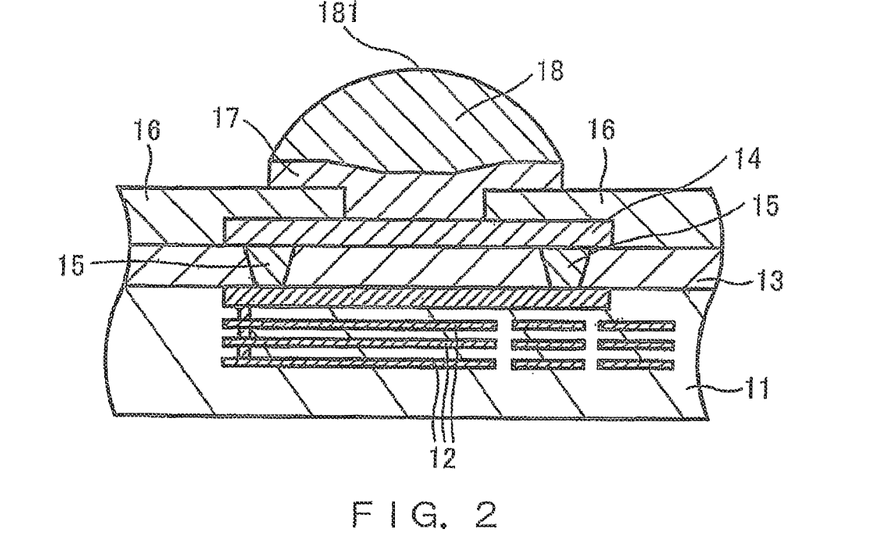
FIG. 2 is a cross-sectional view of the semiconductor chip shown in FIG. 1 taken along a broken line A-A'.

FIG. 1 is a top plan view showing the semiconductor chip constituting the semiconductor device of this embodiment. Meanwhile, FIG. 2 is a structural cross-sectional view of the semiconductor chip shown in FIG. 1 taken along a broken line A-A'. As shown in FIG. 2, in the semiconductor device in this embodiment, the semiconductor chip 11 is a so-called multi-layer wiring structure that includes wiring layers 12 therein and on a surface thereof. The surface of the semiconductor chip 11 provided with these wiring layers 12 is covered with an insulating film 13. Multiple electrode pads 14 are formed by use of Al, for example, on the insulating film 13 that covers the surface of the semiconductor chip 11, and these electrode pads 14 and wiring formed on the uppermost wiring layers 12 are electrically connected to one another through vias 15. A polyimide film 16 serving as an insulating film covers the insulating film 13 provided with the electrode pads 14 as described above except for certain regions on which the electrode pads 14 are provided. A protective metal layer 17 is formed on a certain region of each of the electrode pads 14 and a solder bump 18 is formed on this protective metal layer 17.

In this semiconductor chip 11, the electrode pads 14 are formed at a central part and an outer peripheral part as shown in FIG. 1. The electrode pad 14 formed at the central part are either power source electrode pads 141 or ground electrode pads 142 for elements included in the semiconductor chip 11. On the other hand, the electrode pads 14 formed at the outer peripheral part are signal supply electrodes 143 for supplying signals to the semiconductor chip 11.

Meanwhile, the protective metal layer 17 is the metal layer made of Ni with a film thickness of around 5 μm, for example. However, the film thickness of this protective metal layer 17 is not limited only to the above-mentioned film thickness. Even though the film thickness is preferably set in a range from 3 to 5 μm regardless of the material as will be described later, it is also possible to set a smaller film thickness to such as 2 μm or a film thickness larger than 5 μm, for example. Moreover, when the material is limited to one having an elastic modulus 200 GPa or above, the film thickness only needs to be 1.5 μm or above.

In the semiconductor device according to the first embodiment, the protective metal layer 17 is preferably a single-layered metal layer. This is because the protective metal layer 17 formed of multiple metal layers may cause cracks on interfaces between the respective layers and reduction in mechanical strength.

Figure 3A:
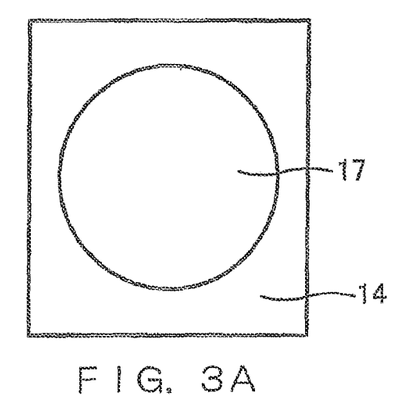
FIG. 3A is a top plan view showing a shape of a protective metal layer formed on an electrode pad.
Figure 3B:
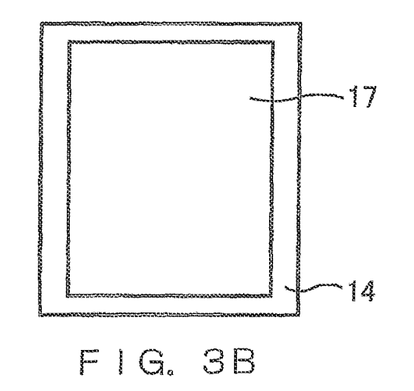
FIG. 3B is a top plan view showing a modified example of the protective metal layer shown in FIG. 3A.
Figure 3C:
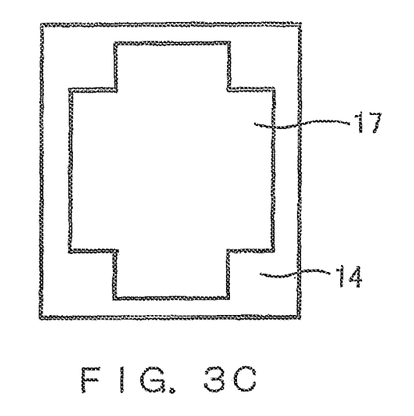
FIG. 3C is a top plan view showing another modified example of the protective metal layer shown in FIG. 3A.

Moreover, the protective metal layer 17 has a circular shape as shown in a top plan view in FIG. 3A. Nevertheless, the shape of the protective metal layer 17 is not limited only to the circular shape and may be any other shapes as far as the protective metal layer 17 is formed so as not to run off the electrode pad 14. Accordingly, the protective metal layer 17 may be formed into a rectangular shape as shown in FIG. 3B, for example. Alternatively, the protective metal layer 17 may be formed into a crisscross shape as shown in FIG. 3C. Although illustration is omitted therein, the protective metal layer 17 may be formed into an octagonal shape. When the protective metal layer 17 is formed into the rectangular shape in particular, the protective metal layer 17 can secure a large surface area. Accordingly, it is possible to increase a volume of the solder bump 18 to be formed on the protective metal layer 17. Therefore, when flip-chip mounting the semiconductor chip 11 on an organic substrate 21 as will be described later, it is possible to suppress poor contact between a solder bump 18 and a stud bump 23 formed on the organic substrate 21 which is caused by displacement upon overlapping the organic substrate 21 with the semiconductor chip 11.

Meanwhile, the surface area of the protective metal layer 17 to be formed either on the power source electrode pad 141 or on the ground electrode pad 142 at the central part has the same area as the surface area of the protective metal layer 17 to be formed on the signal supply electrode pad 143 at the peripheral part. Nevertheless, these surface areas do not always have to be equal to each other. Accordingly, the surface area of the protective metal layer 17 either on the power source electrode pad 141 or on the ground electrode 142 may be greater than the surface area of the protective metal layer 17 on the signal supply electrode pad 143, for example.

Figure 4A:
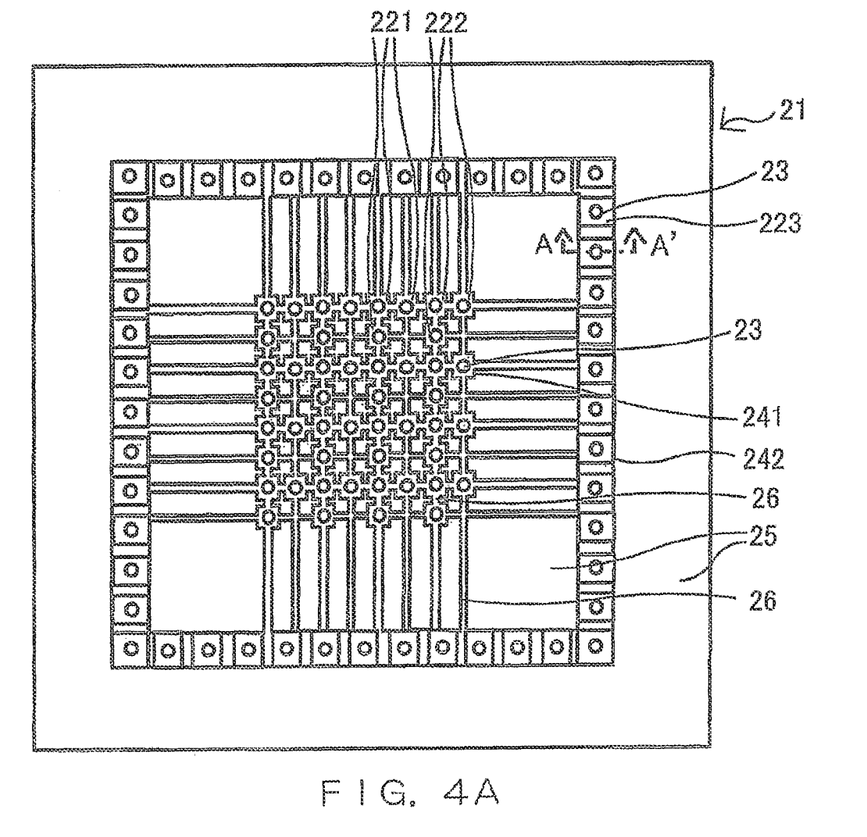
FIG. 4A is a top plan view showing a substrate of the semiconductor device according to the first embodiment.
Figure 5:
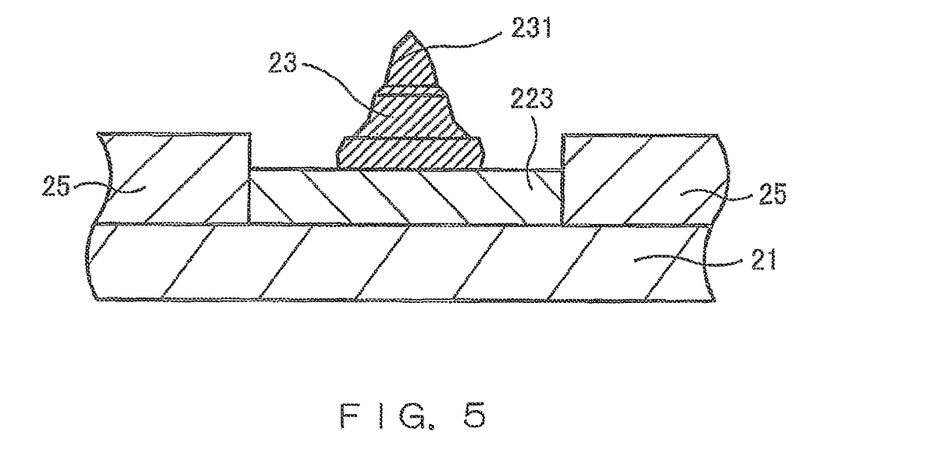
FIG. 5 is a cross-sectional view of the substrate shown in FIG. 4A taken along a broken line A-A'.
Figure 6:
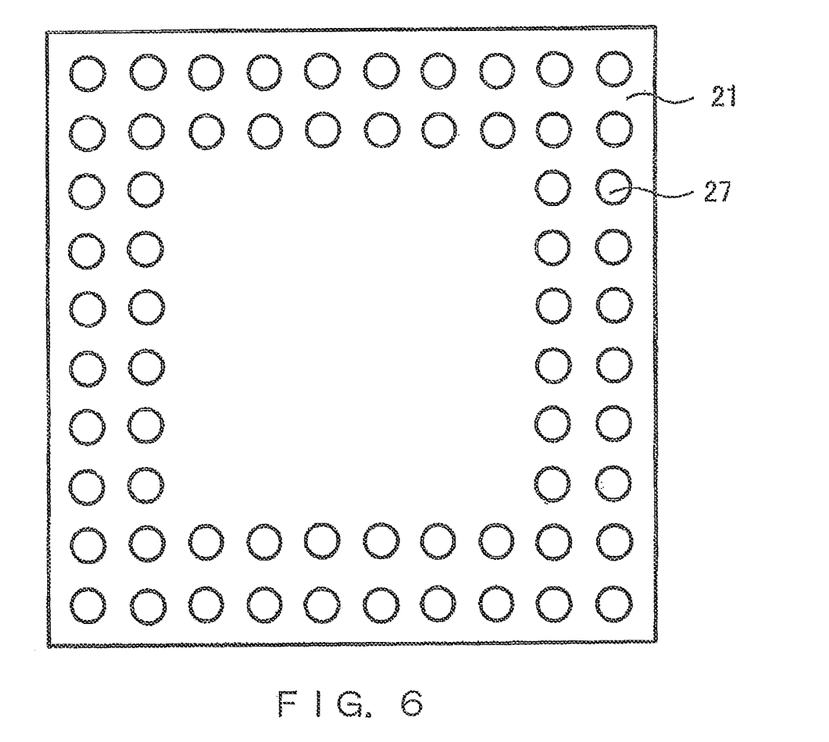
FIG. 6 is a bottom plan view showing the substrate of the semiconductor device according to the first embodiment.

FIG. 4A is a top plan view showing an organic substrate of the semiconductor device according to this embodiment. FIG. 5 is a cross-sectional view of the organic substrate shown in FIG. 4A taken along a broken line A-A'. FIG. 6 is a bottom plan view showing the organic substrate of the semiconductor device according to this embodiment.

Figure 4B:
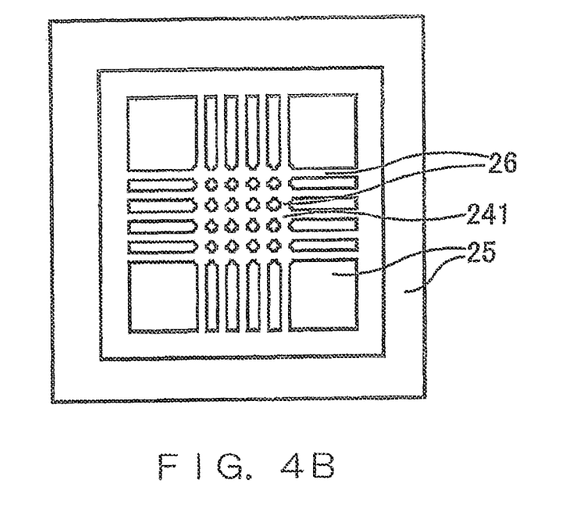
FIG. 4B is a top plan view showing a modified example of FIG. 4A.

As shown in FIG. 4A, on a surface of the organic substrate 21, power source substrate terminals 221, grounding substrate terminals 222, and signal substrate terminals 223 are respectively formed in positions corresponding to the electrode pads 14 of the above-described semiconductor chip 11. The power source substrate terminals 221 are formed in the positions corresponding to the power source electrode pads 141 of the above-described semiconductor chip 11. Similarly, the grounding substrate terminals 222 are formed in the positions corresponding to the ground electrode pads 142 and the signal substrate terminals 223 are formed in the positions corresponding to the signal supply electrode pads 143, respectively. On each of these substrate terminals 221, 222, and 223, a stud bump 23 is formed as shown in FIG. 5. Even though FIG. 5 shows a cross section of a position in FIG. 4A where the stud bump 23 is formed on the signal substrate terminal 223, the stud bump 23 formed on the power source substrate terminal 221 or on the grounding substrate terminal 222 is formed similarly to the stud bump 23 illustrated in FIG. 4A. These stud bumps 23 have a pointed tip end 231, and is made of Au or Cu. Moreover, a solder resist film 25 is formed on the surface of the semiconductor chip 11 provided with the substrate terminals 221, 222, and 223. On the solder resist film 25, rectangular openings 241 are formed in the positions where the power source substrate terminals 221 and the grounding substrate terminals 222 are formed, and frame-shaped openings 242 are formed in the positions where the signal substrate terminals 223 are formed in the frame shape. In this solder resist film 25, each adjacent two of rectangular openings 241, and each rectangular opening 241 and the adjacent the frame-shaped opening 242 are connected to each other through grooves 26. Here, the above-described openings 241 in the positions where the power source substrate terminals 221 and the grounding substrate terminals 222 are provided may be formed into a circular shape as shown in FIG. 4B, for example. Meanwhile, as shown in FIG. 6, solder balls 27 are formed doubly along an outer periphery on a back surface of the above-described substrate 21, for example. As will be described later, these solder balls 25 constitute electrodes for electrically connecting, to external components, the semiconductor device, obtained by flip-chip mounting the semiconductor chip 11 on the above-described organic substrate 21.

Here, the power source substrate terminals 221 and the grounding substrate terminals 222 formed in the rectangular openings 241 will be described with reference to FIG. 7.

Figure 7:
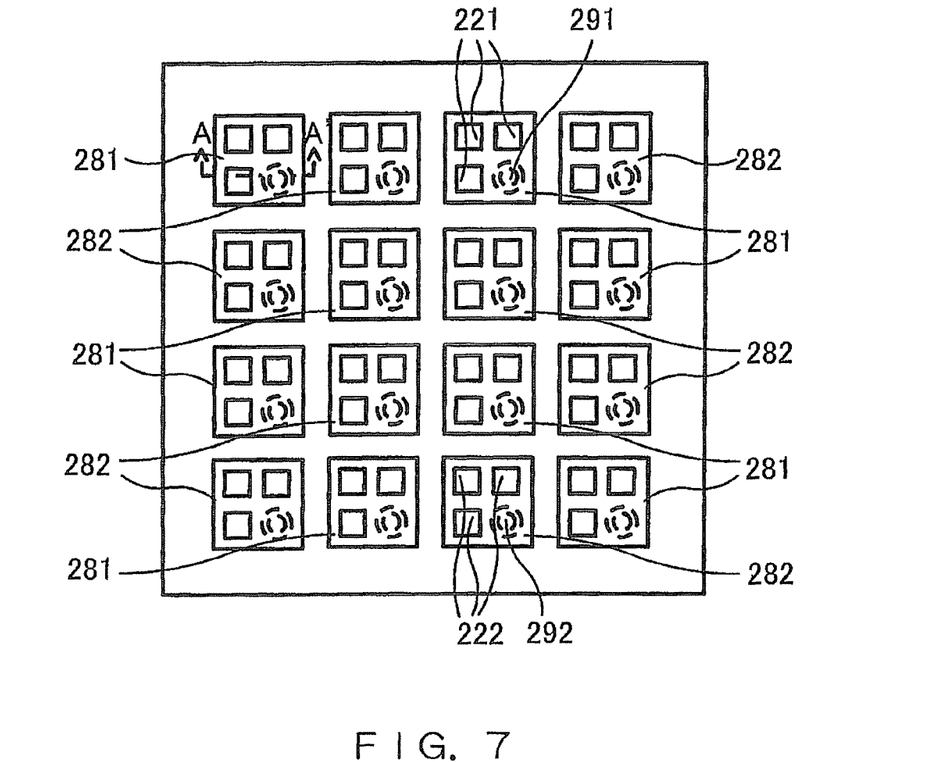
FIG. 7 is a top plan view showing an enlarged view of a central part of the substrate shown in FIG. 4A.
Figure 8:
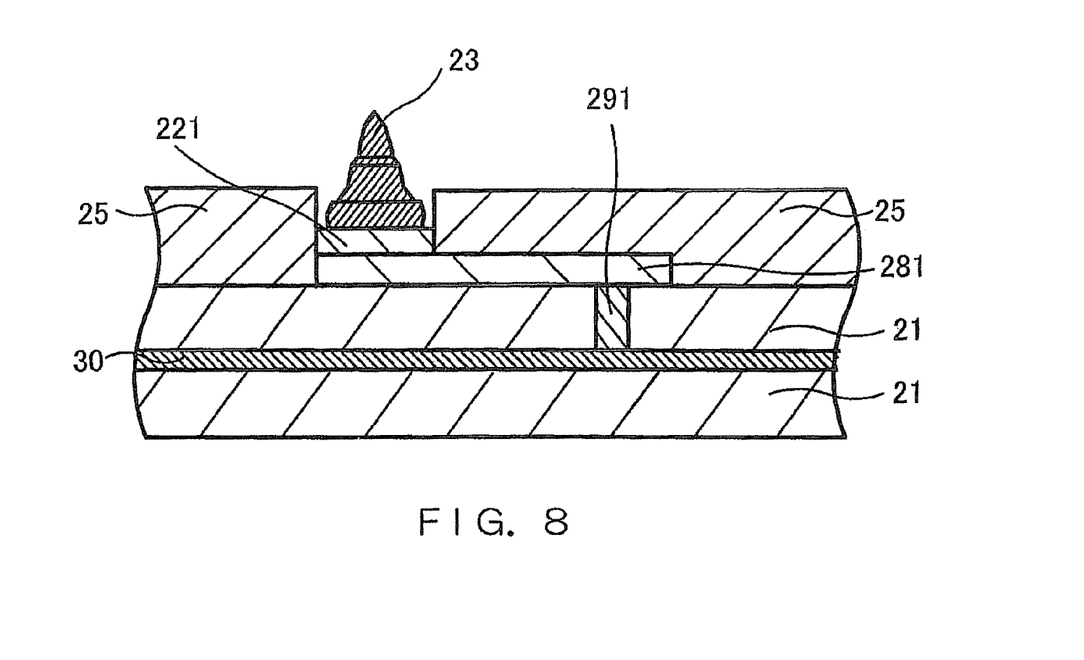
FIG. 8 is a cross-sectional view of the substrate shown in FIG. 7 taken along a broken line A-A'.

FIG. 7 is a partially enlarged view showing an enlarged view of the central part in FIG. 4A. Meanwhile, FIG. 8 is a cross-sectional view taken along a broken line A-A' in FIG. 7. Note that the stud bumps 23 and the solder resist film 25 provided with the grooves 26 and formed on the substrate 21 are not shown in FIG. 7.

As shown in FIG. 7, rectangular power source wirings 281 are formed on the surface at the central part of the substrate 21. Similarly, rectangular grounding wirings 282 are formed on the surface at the central part of the substrate 21. The power source wirings 281 and the grounding wirings 282 are arranged alternately one another to form a matrix.

Three power source substrate terminals 221 are formed on each of the power source wirings 281. Moreover, one power source via 291 is formed on each of the power source wirings 281, and is connected through this via 291 to a power source plate 30, as shown in FIG. 8, which is formed as one layer inside the substrate 21. All the power source wirings 281 that are alternately formed are connected to this power source plate 30 through the respective power source vias 291. This power source plate 30 is connected to an external power source (not shown) for the substrate 21 through the solder balls 27 located on the back surface of the organic substrate 21 shown in FIG. 6 and a voltage is supplied from this external power source to the power source plate 30. Similarly, three grounding substrate terminals 222 are formed on each of the grounding wirings 282. Moreover, one grounding via 292 is formed on each of the grounding wirings 282. The grounding wiring 282 is connected to a grounding plate (not shown), which is formed as one layer inside the substrate 21, through this via 292. All the grounding wirings 282 that are alternately formed are connected to this grounding plate through the respective grounding vias 292. This grounding plate is connected to the solder balls 27 located on the back surface of the organic substrate 21 and is grounded through these solder balls 27.

Figure 9:
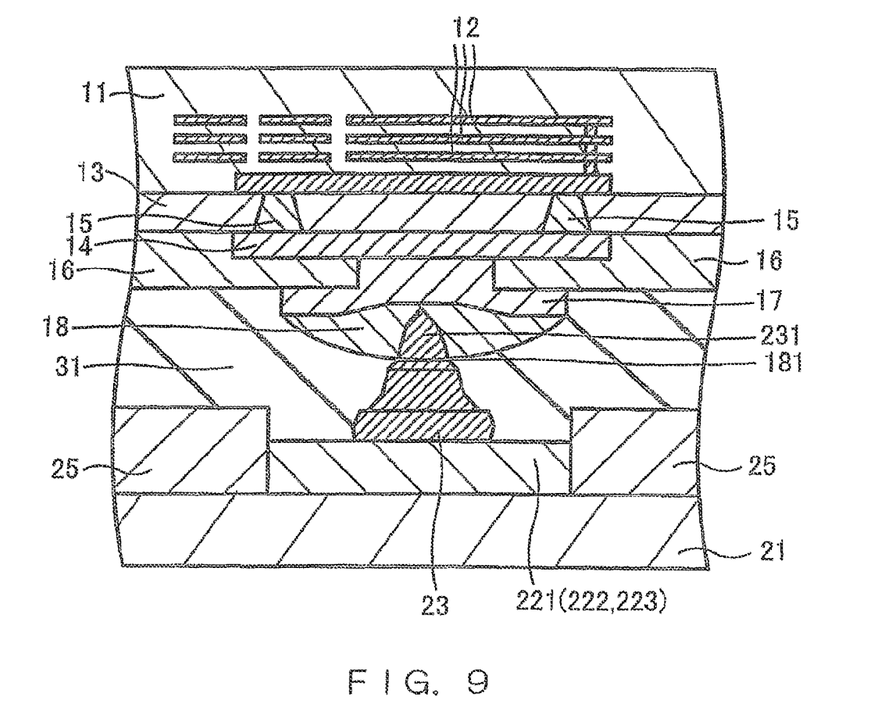
FIG. 9 is a partial cross-sectional view showing part of the semiconductor device according to the first embodiment.

FIG. 9 is a partially cross-sectional view showing the semiconductor device obtained by flip-chip mounting the above-described semiconductor chip 11 on the above-described organic substrate 21.

As shown in FIG. 9, the flip-chip mounted semiconductor device allows the stud bump 23 to be mounted thereon such that the tip end 231 of the stud bump 23 formed on the substrate 21 is inserted to the solder bump 18 formed on the semiconductor chip 11. Moreover, a space between the organic substrate 21 and the semiconductor chip 11 of the semiconductor device thus mounted is filled with underfill resin 31.

Next, a method of mounting the above-mentioned semiconductor chip 11 on the substrate 21 will be described with reference to the accompanying drawings.

First, as shown in FIG. 5, the stud bump 23 having the pointed tip end 231 is formed on the signal substrate terminal 223 shown in FIG. 4A in accordance with a thermosonic bonding method. At the same time, as shown in FIG. 8, for example, the stud bump 23 having the pointed tip end 231 is formed on the power source substrate terminal 221 or the grounding substrate terminal 222 shown in FIG. 4A in accordance with the thermosonic bonding method.

In the meantime, as shown in FIG. 2 for example, the protective metal layer 17 of the semiconductor chip 11 shown in FIG. 1 is formed on each of the power source electrode pads 141, the ground electrode pads 142, and the signal electrode pads 143 by electroplating using Ni (elastic modulus 200 GPa). At this time, the film thickness of the protective metal layers 17 to be formed on the respective electrode pads 141, 142, and 143 is set is 5 µm, for example. This is the film thickness necessary for achieving sufficient mechanical strength for suppressing damages that may occur on the wiring layers 12 and the insulating film 13 at the time of mounting the semiconductor chip 11 thereon. This film thickness is obtained from results of simulation shown below.

Figure 10A:
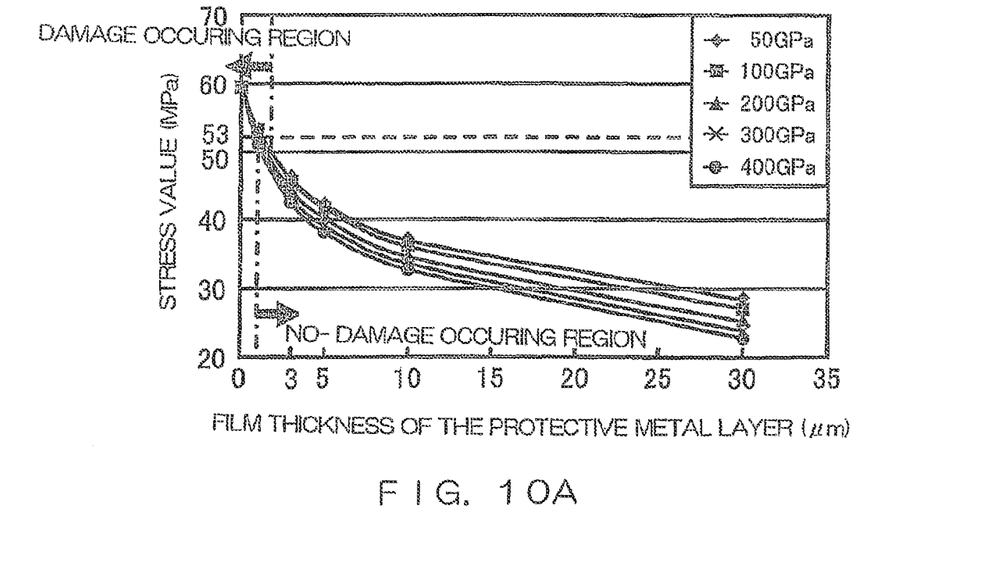
FIG. 10A is results of simulation showing correlations between a film thickness of a protective metal layer and a stress generated between a wiring layer and an insulating film which are located below an electrode pad.
Figure 10B:
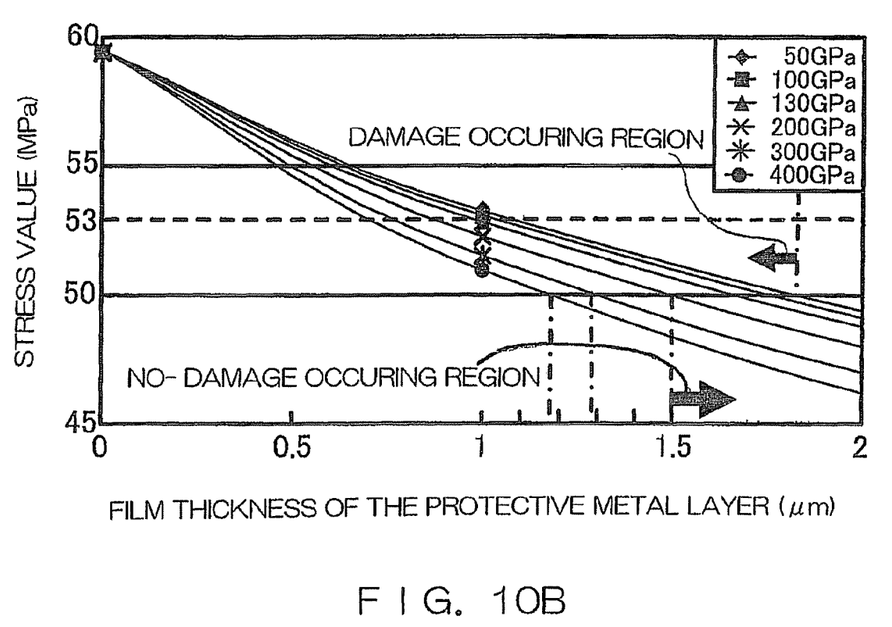
FIG. 10B is partially enlarged results of the simulation in FIG. 10A.
Figure 10C:
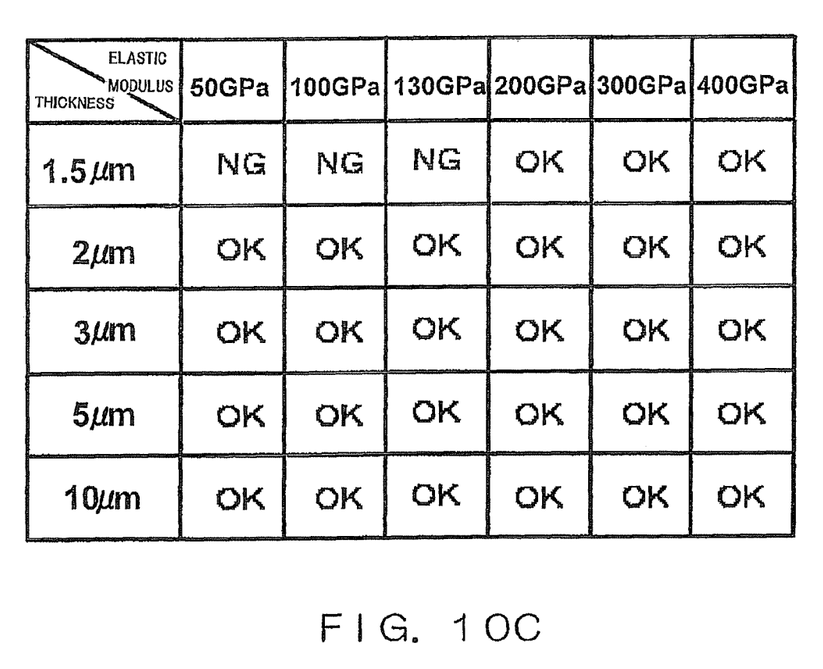
FIG. 10C is a chart showing a summary of the results in FIG. 10A and FIG. 10B.

FIG. 10A represents results of simulation showing correlations among the film thickness of the protective metal layer 17, the elastic modulus thereof, and stress acting between the wiring layers 12 and the insulating film 13. Meanwhile, FIG. 10B shows partially enlarged results of simulation in FIG. 10A. FIG. 10C is a chart showing a summary of the results in FIG. 10A and FIG. 10B. Note that FIG. 10A does not show a result when the elastic modulus is set to 130 GPa.

It is assumed that a simulation model is obtained by forming an electrode pad on a semiconductor chip having a multilayer structure with an insulating film interposed therebetween and forming a protective metal layer on this electrode pad. In reality, a solder bump is formed on the protective metal layer, but is disregarded as being melted at the time of mounting. Calculations have been made of stresses to be generated between the wiring layer and the insulating layer in the case of applying a certain pressure from above to the protective metal layer in the above-described model while changing the film thickness and the elastic modulus of the protective metal layer. Calculation is executed in accordance with the finite element method.

It is apparent from FIG. 10A and FIG. 10B that providing the protective metal layer reduces the stress to be generated between the wiring layer and the insulating film below the electrode pad. Moreover, it is also apparent that the stress to be generated depends more strongly on the film thickness of the protective metal layer than the elastic modulus thereof. In other words, it is apparent that the protective metal layer can suppress damages to be generated between the wiring layer and the insulating film more efficiently by forming the protective metal layer in a desired film thickness rather than selecting an appropriate material.

Now, a region in FIG. 10A or FIG. 10B where a stress value falls below 53 MPa as indicated with a dotted line will be considered as a no-damage occurring region. This value is obtained by an experiment.

In the experiment, the semiconductor chip is arranged parallel to the substrate provided with the stud bumps and a pressure is applied from above to the semiconductor chip while the semiconductor chip is kept parallel to the substrate. Meanwhile, an examination was made of a correlation between the stress generated between the wiring layer and the insulating layer and an error rate occurring between the wiring layer and the insulating layer in response to the stress. Results are shown in FIG. 11.

Figure 11:
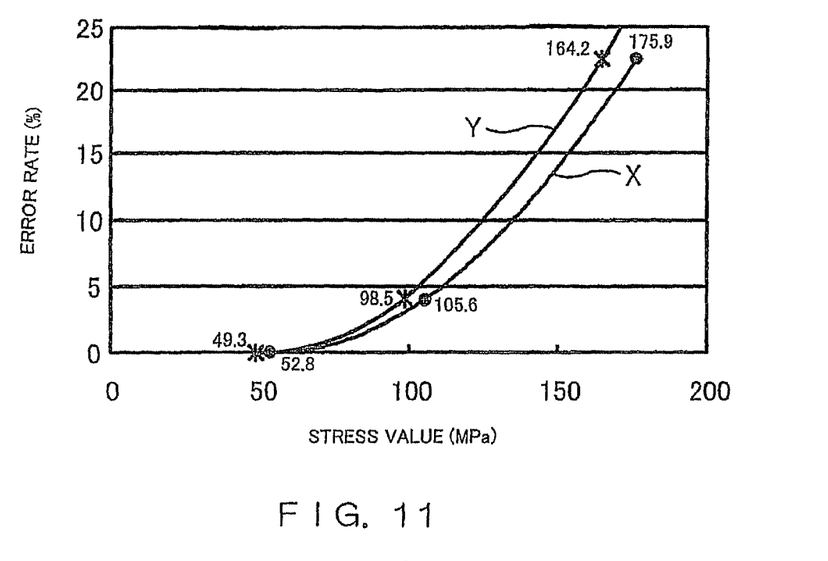
FIG. 11 is results of experiments showing correlations between an error rate and a stress value to be applied between the wiring layer and the insulating film which are located below the electrode pad.

In FIG. 11, the lateral axis indicates the stress value (the stress value (MPa)) that occurs between the wiring layer and the insulating layer. The longitudinal axis indicates the error rate (defect percentage (%) below pad) occurring between the wiring layer and the insulating layer. Here, the results of the above-mentioned experiment are indicated with a curve X in FIG. 11.

According to the curve X in FIG. 11, it is apparent that the error rate occurring between the wiring layer and the insulating layer is 0 (%) when the stress value is 52.8 (MPa) or below. That is, no damages will occur between the wiring layer and the insulating film when the stress value is below 53 MPa. According to FIG. 10B, it is apparent that the stress value can be set below 53 MPa by forming the protective metal layer with a film thickness of 1 μm or above when the elastic modulus thereof is 200 GPa or above. Moreover, it is also apparent from FIG. 10B that the stress value can be set below 53 MPa irrespective of the elastic modulus of the protective metal layer by setting the film thickness thereof to 1.1 μm or above.

The above-described experiment shows results when the semiconductor chip that is kept parallel to the substrate is mounted, in a so-called ideal manner, on the substrate with a pressure. However, in reality, there is also a case where the semiconductor chip is mounted obliquely relative to the substrate. In this case, the pressure to be applied will vary depending on the location of the semiconductor chip even if the pressure is applied in a similar manner to the above-described experiment. Accordingly, another experiment similar to the above-described experiment is conducted while the semiconductor chip is inclined as much as possible relative to the substrate based on a prerequisite that all the stud bumps provided on the substrate are connected to the solder bumps that are provided on the semiconductor chip. Results of this experiment are indicated with a curve Y in FIG. 11.

According to the curve Y in FIG. 11, it is apparent that the error rate occurring between the wiring layer and the insulating layer is 0 (%) when the stress value is 49.3 (MPa) or below. That is, there will be no damages between the wiring layer and the insulating film when the stress value is below 50 MPa.

As described above, considering the curves X and Y in FIG. 11 at the same time, the no-damage occurring region can be obtained when the stress value is below 50 MPa based on the prerequisite that all the stud bumps provided on the substrate are connected to the solder bumps that are provided on the semiconductor chip.

According to FIG. 10B based on this result, it is apparent that the stress value can be set below 50 MPa if the protective metal layer is formed with a film thickness of 1.5 μm or above when the elastic modulus thereof is 200 GPa or above. Meanwhile, the protective metal layer should be formed with a film thickness of 1.3 μm or above when the elastic modulus thereof is 300 GPa or above, or the protective metal layer should be formed with a film thickness of 1.2 μm or above when the elastic modulus thereof is 400 GPa or above. Moreover, it is also apparent from FIG. 10B that the stress value can be set below 50 MPa by setting a film thickness to 2 μm or above irrespective of the elastic modulus of the protective metal layer.

That is, appropriate conditions of the protective metal layer formed so as not to cause damages between the wiring layer and the insulating film includes setting a film thickness to 1.5 μm or above when the elastic modulus is 200 GPa or above as shown in FIG. 10B and FIG. 10C. Alternatively, it is also possible to say that the film thickness of the protective metal layer should be set to 2 μm or above irrespective of the elastic modulus thereof.

However, considering that the film thickness would vary slightly in actual fact depending on manufacturing variation attributable to manufacturing processes, it is preferable to set a film thickness to 3 μm or above. Further, according to FIG. 10A, it is apparent that damages between the wiring layer and the insulating film can be reduced more, as a film thickness is set larger. Nevertheless, considering that a longer manufacturing period and a larger amount of raw materials are required for forming the thicker protective metal layer, it is preferable to set a film thickness to 5 μm or below.

Therefore, ideally speaking, the protective metal layer 17 is preferably formed with a film thickness of 1.5 μm or above when made of a material with an elastic modulus of 200 GPa. However, practically speaking, the protective metal layer 17 is preferably formed with a film thickness of ranging from 3 to 5 μm when made of a material with an elastic modulus of 200 GPa. The film thickness 5 μm of the protective metal layer 17 cited above is based on the results of the simulation and the experiments.

Here, the reason for selecting the Ni (the elastic modulus 200 (GPa)) as the material of the protective metal layer 17 is as follows.

According to the results of simulation described above, it is apparent that a material serves as the protective metal layer as far as the material has the elastic modulus exceeding 200 GPa, which is the elastic modulus of Ni, even with a film thickness below 1.5 μm. For example, the material having the elastic modulus exceeding 200 GPa are as follows.

Included are silicon nitride (about 310 GPa), chromium (290 GPa), beryllium and an alloy thereof (about 320 GPa), tungsten and an alloy thereof (about 410 GPa), and beryllia (about 390 GPa).

However, the materials have less versatility as the semiconductor materials than Ni does used in this embodiment and are therefore not generally employed. Accordingly, Ni is used as the material of the protective metal layer 17 here because Ni has the highest elastic modulus among the generally used materials.

According to the reason stated above, the protective metal layer 17 made of Ni is formed with a film thickness of 5 μm on the electrode pad 14 of the semiconductor chip 11, and then the solder bump 18 is formed by plating on the protective metal layer 17 as shown in FIG. 2.

As described above, the stud bumps 23 are formed on the substrate terminals 221, 222, and 223 of the substrate 21. In the meanwhile, after the protective metal layers 17 and the solder bumps 18 are formed on the electrode pads 14 of the semiconductor chip 11, the semiconductor chip 11 is positioned by a face-down method so as to have the solder bumps 18 located immediately above the stud bumps 23 on the substrate 21.

Next, the tip ends 231 of the stud bumps 23 is inserted into the solder bumps 18 by thermo-compression bonding method or ultrasonic method so that the semiconductor chip 11 is flip-chip mounted on the substrate 21. Here, the temperature of the solder bumps 18 is set in a range from 250° C. to 280° C. when the tip ends 231 of the stud bumps 23 is inserted into the solder bumps 18.

Lastly, the underfill resin 31 is filled in the space between the substrate 21 and the semiconductor chip 11 in the mounted state. Accordingly, the semiconductor device of this embodiment as shown in FIG. 9 can be obtained.

As described above, the semiconductor device of this embodiment can reduce the stress to be generated between the wiring layers 12 and the insulating film 13 that are located below the electrode pad 14, by forming the protective metal layer 17 with a film thickness ranging from 3 to 5 μm on the electrode pad 14 of the semiconductor chip 11. Here, the stress are attributable to ultrasonic vibration, a mechanical stress of an applied load, and a thermal stress at the time of mounting the semiconductor chip 11 on the organic substrate 21. Meanwhile, the stress to be generated between the wiring layers 12 and the insulating film 13 below the electrode pad 14 can be reduced by forming the protective metal layer 17 made of the material having the elastic modulus 200 GPa or above to have a film thickness of 1.5 μm or above. In this way, damages occurring between the wiring layers 12 and the insulating film 13 can be reduced.

Moreover, the electrode pads 14 can be formed at the central part of the semiconductor chip 11 since the damages occurring between the wiring layers 12 and the insulating film 13 during a mounting operation are reduced. For example, the power source electrode pads 141 and the ground electrode pads 142 can be formed at the central part of the semiconductor chip 11. In this way, it is possible to provide a semiconductor device having excellent electric properties.

To be more precise, it is possible to reduce the length of wiring between the power source electrode pads 141 and the semiconductor element or between the ground electrode pads 142 and the semiconductor element. Here, the semiconductor element is provided at the central part of the semiconductor chip 11. Therefore, the voltage fed from the external power source can be efficiently supplied to the semiconductor element.

Particularly, in the above-described embodiment, the power source electrode pads 141 and the ground electrode pads 142 are alternately formed at the central part of the semiconductor chip 11. Therefore, the power source electrode pad 141 and the ground electrode pad 142 are always formed in the vicinity of each semiconductor element included in the semiconductor chip 11. Accordingly, the wiring for connecting each semiconductor element to the power source electrode pad 141 or the ground electrode pad 142 can be made short on average. In this way, the voltage can be more efficiently supplied to each semiconductor element.

According to the semiconductor device of this embodiment, it is possible to form the electrode pads 14 not only at the central part of the semiconductor chip 11 but also in any other positions. Therefore, the electrode pads 14 that have been localized at the outer peripheral part may be dispersed toward the central part. Hence the semiconductor chip can be reduced in size.

Moreover, the electrode pads 14 can be formed in any positions. According to the positions of the electrode pads 14 to be formed on the semiconductor chip 11, it is also possible to form the electrodes 221 (222, 223) on the substrate 21 in a dispersed manner toward the outer peripheral part unlike a conventional substrate provided with the electrodes throughout the surface of the substrate. Therefore, the number of the electrodes 222 (223) at the central part can be reduced. The more the electrodes 222 (223) are provided at the central part, the more the wiring layers on the substrate 21 are required for connecting the electrodes 222 (223) to external components. However, as the number of the electrodes 222 (223) at the central part can be reduced, the number of the wiring layers on the substrate 21 can therefore be reduced. Hence the substrate can be manufactured with less cost.

Moreover, in the above-described embodiment, the solder resist film 25 formed on the substrate 21 have the openings 241 and 242 at the positions where the substrate terminals 221, 222, and 223 are formed, and the respective openings 241 and 242 are connected to one another by the grooves 26. In the conventional structure in which the solder resist film has no grooves, the semiconductor chip 11 is mounted on the substrate 21 so as to have a small interval therebetween. When the underfill resin 31 is filled in such a small interval, large resistance is generated to a flow of the underfill resin 31. This leads to fluctuation in the filling rate that incurs voids. However, in this embodiment, the grooves 26 are formed for connecting the openings 241 and 242. The grooves 26 can improve the filling rate of the underfill resin 31 that flows in the interval between the substrate 21 and the semiconductor chip 11. Therefore, with less fluctuation in the filling rate, the underfill resin 31 can be filled in the interval without generation of any voids. Accordingly, it is possible to provide a semiconductor device having even more excellent electric properties.

Moreover, since the electrode pads 14 can be formed at the central part of the semiconductor chip 11 as described above, it is possible form a wiring layer below these electrode pads 14.

Further, the power source substrate terminals 221 and the grounding substrate terminals 222 on the organic substrate 21 are respectively connected to the power source plate 30 and the grounding plate (not shown) formed inside the substrate 21 and are connected to the solder balls 27 on the back surface of the substrate 21 through the power source plate and the grounding plate. Therefore, it is possible to reduce the number of through-holes to penetrate the wiring layers on the substrate as compared with the conventional structure in which the terminals 221 and 222 at the central part are connected to the solder balls on the back surface of the substrate with through-holes provided immediately below the terminals 221 and 222.

Moreover, in this embodiment, the substrate terminals 221, 222, and 223 are provided with the stud bumps so that no solder bumps 18 are formed on the substrate terminals 221, 222, and 223. Accordingly, it is not necessary to regulate amounts of the solder bumps 18 as well as positions of tip ends 181 of the solder bumps 18. Therefore, it is possible to design, with high freedom, dimensions of the openings on the solder resist film 25 at the substrate terminals 221, 222, and 223 on the substrate 21.

As described above, according to this embodiment, it is possible to realize the semiconductor device in which the substrate and the semiconductor chip are designed with high freedom.

(Second Embodiment)

Next, a semiconductor device according to a second embodiment of the present invention will be described with reference to FIG. 12. Note that the basic structure of the second embodiment is similar to that of the first embodiment. Accordingly, features different from those of the first embodiment will be described below.

Figure 12:
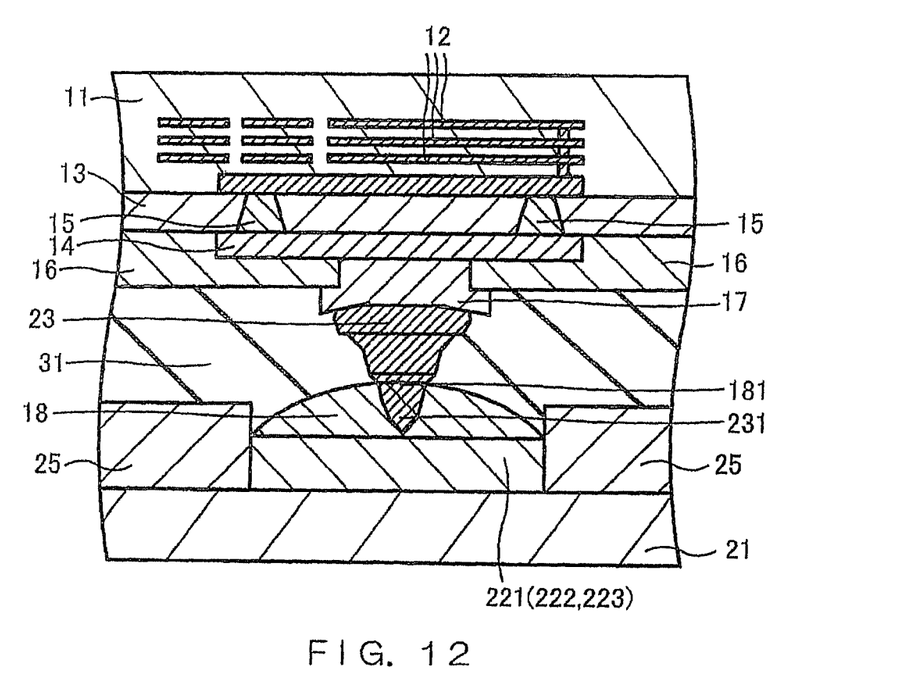
FIG. 12 is a structural cross-sectional view showing a semiconductor device according to a second embodiment.

FIG. 12 is a structural cross-sectional view showing the semiconductor device of this embodiment. In the semiconductor device shown in FIG. 12, the solder bumps 18 are formed on the substrate terminals 221, 222, and 222 that are formed on the surface of the substrate 21. On the other hand, the stud bumps 23 are formed on the protective metal layers 17 that are formed on the semiconductor chip 11. In this semiconductor device according to the second embodiment as well as the first embodiment, the protective metal layers 17 is formed on the electrode pads 14 of the semiconductor chip 11 to have a film thickness of 2.0 μm or above, or a film thickness of 1.5 μm or above when the material having the elastic modulus 200 GPa or above is used. Moreover, the stud bumps 23 are formed on these metal protective metal layers 17. Therefore, the effects similar to those in the first embodiment can be achieved in this embodiment. Here, the film thickness of the protective metal layer 17 is set preferably in a range from 3 to 5 μm.

Meanwhile, in this embodiment, the stud bumps 23 are formed on the semiconductor chip 11 through the protective metal layers 17. In general, the stud bumps 23 are formed by the thermosonic bonding method. When the protective metal layers 17 are not provided, the wiring layers 12 and the insulating film 13 will be damaged by a load applied when the stud bumps 23 are formed and mechanical stress attributable to ultrasonic waves. However, the protective metal layers 17 are provided in this embodiment. Accordingly, the wiring layers 12 and the insulating film 13 are less likely to be damaged when the stud bumps 23 are formed.

Although embodiments of the present invention have been described above, it is to be understood that the present invention will not be limited only to these embodiments and various modifications are possible without departing from the scope of the invention.

For example, the number of the electrode pads 14 to be formed on the semiconductor chip 11, the number of the substrate terminals 221 to be formed on the substrate 21, and the number of the solder balls 27 to be formed on the back surface of the substrate 21 will not be limited to the numbers as illustrated in the drawings.

Moreover, in this embodiment, the power source substrate terminals 221 and the grounding substrate terminals 222 are formed on the power source lines 281 and the groundling lines 282 that are alternately formed in the matrix fashion as described above. However, the power source lines 281 and the grounding lines 282 do not always have to be arranged alternately in the matrix fashion, but may be formed in any positions as far as the positions correspond to the power source electrode pads 141 and the ground electrode pads 142 to be formed at the central part of the semiconductor chip 11.

In addition, in the semiconductor devices of the respective embodiments described above, a barrier metal layer, for example may be formed between each electrode pad 14 and each protective metal layer 17. Here, this barrier metal layer is formed to be extremely thin and thus has very small mechanical strength. Therefore, this barrier metal layer does not function as the protective metal layer 17 and is not therefore included in the protective metal layer 17 in this invention.

What is claimed is:

1. A semiconductor device comprising:
    a semiconductor chip of a multilayer wiring structure including
    an insulating film formed on a surface of the semiconductor chip,
    a plurality of electrode pads formed at a central part and an outer peripheral part of the insulating film, and
    a plurality of protective metal layers formed respectively on the electrode pads; and
    a substrate including a plurality of substrate terminals formed on a surface thereof respectively in positions corresponding to the electrode pads,
    wherein the semiconductor chip is a flip-chip mounted on the substrate by inserting a tip end of a stud bump to a solder bump, the stud bump formed on any one of each of the protective metal layers and each of the substrate terminals, the solder bump formed on the other one of each of the protective metal layers and each of the substrate terminals.

2. The semiconductor device according to claim 1, wherein each of the protective metal layers is a single metal layer having an elastic modulus of not less than 200 GPa and a film thickness of not less than 1.5 μm.

3. The semiconductor device according to claim 1, wherein the plurality of electrode pads formed at the central part of the semiconductor chip includes a power source electrode pad and a ground electrode pad.

4. The semiconductor device according to claim 1, wherein the substrate has a multilayer wiring structure including a layer provided with an electrode plate to which the substrate terminals respectively corresponding to the power source pads are connected by way of vias.

5. The semiconductor device according to claim 4, wherein the substrate includes a solder resist film formed on the surface thereof, the solder resist film including openings respectively formed in positions where the substrate terminals are provided, the openings connected to one another by grooves.

* * * * *